United States Patent [19]

Lockwood et al.

[11] Patent Number: 4,683,554
[45] Date of Patent: Jul. 28, 1987

[54] DIRECT WRITE NONVOLATILE MEMORY CELLS

[75] Inventors: George C. Lockwood, Dayton; James A. Topich, Centerville; Raymond A. Turi, Miamisburg; George H. Maggard, Xenia, all of Ohio

[73] Assignee: NCR Corporation, Dayton, Ohio

[21] Appl. No.: 775,980

[22] Filed: Sep. 13, 1985

[51] Int. Cl.[4] .............................................. G11C 11/40
[52] U.S. Cl. .................................................... 365/185
[58] Field of Search ........................................ 365/185

[56] References Cited

U.S. PATENT DOCUMENTS

| | | | |
|---|---|---|---|
| 4,209,849 | 6/1980 | Schrenk | 365/185 |
| 4,399,523 | 8/1983 | Gerber et al. | 365/185 |
| 4,531,203 | 7/1985 | Masuoka et al. | 365/218 |
| 4,546,454 | 10/1985 | Gupta et al. | 365/200 |

Primary Examiner—James W. Moffitt
Attorney, Agent, or Firm—Wilbert Hawk, Jr.; Casimer K. Salys

[57] ABSTRACT

A floating gate type nonvolatile memory cell of the general class known as electrically erasable programmable read only memories, configured with a single polysilicon layer, operable in a direct write mode, and characterized by its absence of read disturb. In one form of its practice, the floating gate is divided into three regions situated with relation to specified regions in the substrate. The first region of the floating gate is dielectrically isolated from a conductively doped region in the substrate so as to form a capacitor; the second region is similarly situated, but forms a significantly smaller capacitor and utilizes a dielectric suitable for Fowler-Nordheim tunneling or Poole-Frenkel conduction of charge therethrough; and the third region overlaps a channel of a field effect type sense transistor, conduction through which is responsive to the charge resident on the floating gate. Access to the substrate regions is by way of three electrically independent but simultaneously enabled access transistors. Writing of data is accomplished by the division of voltage between capacitors, while reading is accomplished by detecting the conductive state of the sense transistor in an electrically independent conductive path.

9 Claims, 8 Drawing Figures

DIRECT WRITE NONVOLATILE MEMORY CELLS

BRIEF SUMMARY

The present invention relates to the structural and electrical arrangement of a nonvolatile memory cell, which cell according to a preferred practice of the invention forms one of multiple, individually addressable cells within an array residing on a common integrated circuit chip. More specifically, the present invention is directed to a particular form of cell from within the class known as floating gate type electrically erasable programmable read only memories (EEPROMs). Functionally, the cell to which this invention pertains is unique first in its provision of a direct write capability, and second by the absence of read disturb during the addressing of the cell for its data content. Moreover, these highly beneficial features are provided by a cell arrangement which can be fabricated with commonly practiced single polysilicon (poly) fabrication processes.

According to one practice of the invention, a cell is arranged to have three columnar oriented conductive paths, individually connected to correspondingly oriented lines comprised of one bit line and two write lines. The connection between each column line and its corresponding conductive path is made through a field effect transistor, with all three transistors being concurrently enabled by a row oriented row line connected to each of the three access transistor gate electrodes. In the first conductive path, and situated between the bit line access transistor and a ground potential node, the cell further includes a field effect sense transistor. The gate electrode of the sense transistor is one extension of the floating gate of the nonvolatile memory cell. A continuation of this floating gate electrode interacts by capacitive coupling with an ion implant conductively doped region of the substrate forming a portion of the adjacent, second conductive path, which region is itself electrically connected to the source electrode of the access transistor of the first write line. A further extension of the floating gate is capacitively coupled to a doped region connected to the source electrode of the access transistor in the remaining write line, forming the third conductive path. The dielectric materials, the dielectric layer thicknesses, and the dimensions for the capacitive coupling areas are selected so that the capacitive coupling between the floating gate and the second conductive path is materially greater than that to the third conductive path.

A cell of the form described provides not only the benefits of floating gate type nonvolatile operation and the fabrication flexibility of a single polycrystalline silicon gate electrode layer, but now also provides both direct write capability, and even more importantly, the ability to read without disturbing the data being nonvolatilely stored in the cell. Furthermore, according to one practice of the invention, the design rules for the diffused bit line itself, and the active devices connected thereto, can be based on low operating voltages, while relegating to the higher voltages only the two write lines and devices connected thereto.

Binary form data is created in the nonvolatile memory cell by the transfer of charge to or from the floating gate during a single write/program cycle, irrespective of the previous data resident in the cell. The write cycle generally comprises an enablement of the access transistors connected to the two write lines and the concurrent but selective application of voltages, for example zero volts and 15 volts, to the write lines in a polarity corresponding to the binary state to be generated on the floating gate. Upon such enablement of the access transistors, the floating gate is by capacitive coupling maintained at or near the potential of the highly coupled doped region. In so doing, an electric field substantially proportional to the full write voltage appears across the dielectric separating the floating gate electrode from the doped region of minimal capacitive coupling. As is commonly known, when the electric field intensity and the dielectric material characteristics are appropriately selected, electrical charge will be transferred through the dielectric. Preferably, and according to the present invention, the transfer of charge is by Fowler-Nordheim tunneling, Poole-Frenkel conduction, or some combination of the two mechanisms. Upon the removal of the write voltage the floating gate retains a residual of the charge previously transferred through such low capacitance dielectric region.

The binary data stored in the cell, as represented by the charge on the floating gate, can be read by detecting the conductive state of the sense transistor, whose gate electrode is the floating gate and which itself forms a series conductive path through its respective access transistor to the addressable bit line.

These and other features of the invention will be more fully appreciated upon considering the embodiments set forth in the detailed description which follows.

DETAILED DESCRIPTION

Many of concepts which underlie the structure, operation and benefits of a single poly, floating gate type nonvolatile memory cell are aptly described by authors Cuppens et al. in the article entitled "An EEPROM for Microprocessors and Custom Logic," *IEEE Journal Solid-State Circuits*, Vol. SC-20, No. 2, April 1985, pp 603–608, and in a paper of the same authorship and title given at the 1984 IEEE International Solid State Circuits Conference on Feb. 24, 1984.

Figure 1:
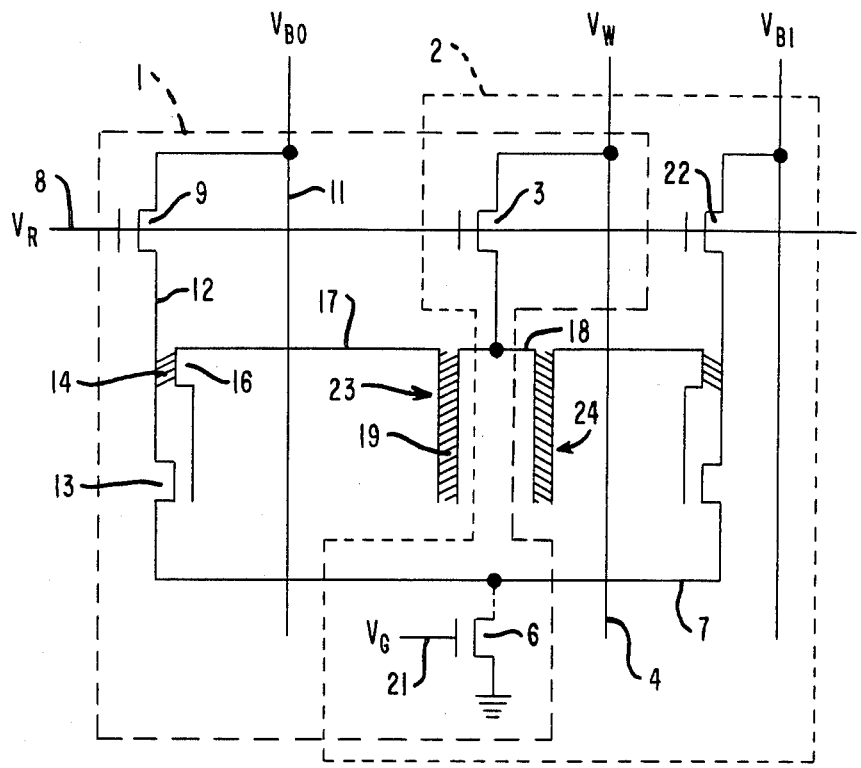
FIG. 1 is an electrical schematic for a floating gate nonvolatile memory device of the prior art, involving two, individually addressable but structurally interrelated single poly floating gate cells.

The composite cell configuration which these references disclose is schematically depicted on FIG. 1 of the drawings. As shown there, a left cell 1, defined by a perimeter of long dashed lines, and a right cell 2, defined by a perimeter of short dashed lines, share access transistor 3 from write line 4 as well as transistor 6, suitable to ground the conductive path 7. Left cell 1 is further composed of row line 8 for simultaneously enabling access transistors 3 and 9. Transistor 9 when enabled connects bit line 11 to conductive path 12, which conductive path is preferably a source/drain type diffusion joining access transistor 9 to sense transistor 13. In proximity to conductive path 12, but separated by charge transfer dielectric 14 therefrom, there is situated a segment 16 of conductive floating gate electrode 17, as shown. Floating gate electrode 17 itself extends at the opposite end to a position adjacent similarly conductive path 18, and is of suitable size and proximity to conductive path 18 to provide by way of dielectric 19 an effective capacitive coupling significantly greater than that created by the proximity of electrode segment 16 to diffusion 12. According to the described configuration, 18 is an extension of the source/drain diffusion for transistor 3. The remaining element in left side cell 1 is grounding transistor 6, which connects the conductive path 7 to ground potential upon receiving an enablement signal on line 21.

One detracting feature of the paired cell depicted in FIG. 1 is the lack of capability to directly write either cell, or stated otherwise, the inability to program the state of the cell to a binary 0 or 1 without undergoing a preceding erase operation. This is attributable to the fact that the coupling capacitors 23 and 24 both share line 18, and thereby couple the same conductive path (line) 18 potential to both floating gates. This requires that the potential on line 18 remain fixed during the write/program operation for the data in the non-selected cell to remain intact. Voltages $V_{B0}$ and $V_{B1}$ are the variables during the write cycle, and the write operation can only transfer charge in one direction. Therefore, this configuration requires that both cells be erased before writing new data into either of the two cells. As one of skill in the art will appreciate, the need for both erase and write cycles to effect the entry of data into a cell, in contrast to a single direct write cycle, increases the functional complexity of the operations to be performed on the chip, and consequently the chip area consumed by the timing and control circuitry.

The two cell configuration depicted in FIG. 1 also suffers from another disadvantage, the potential for having the nonvolatily stored data disturbed during a read cycle if the read cycle bit line, e.g. $V_{B1}$, and write line voltages, are not the same. The use of such different voltages for e.g. $V_{B1}$ and $V_W$ is not uncommon with floating gate devices in that it allows for the centering of the reference level within the memory window. Even minimal amounts of read disturb are considered highly undesirable when repeated read addressing of the cell is possible, such as is common in high clock rate microprocessors operating in looped cycles. On the other hand, the ability to selectively set the voltages e.g. $V_{B1}$ and $V_W$ during the read cycle is a desirable feature if the nonvolatile data is to be stored and reliably retrieved over an extended time period, namely when the memory window shrinks.

Figure 2:
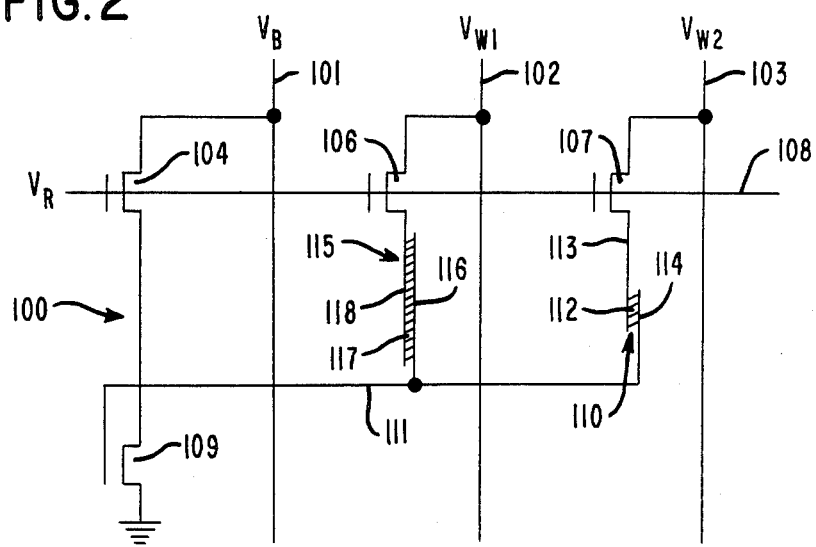
FIG. 2 is an electrical schematic of the preferred nonvolatile memory cell according to the present invention, now including the direct write and no read disturb capabilities in a single poly floating gate configuration.

The presently disclosed and claimed invention provides both a direct write capability and an absence of any read disturb, while retaining a single poly floating gate structure suitable for inclusion into conventional integrated circuit fabrication processes. The preferred embodiment of the nonvolatile memory cell to which the invention pertains is schematically depicted in FIG. 2 of the drawings; a corresponding layout of the cell appears in FIG. 3. An alternate embodiment of the invention is shown schematically in FIG. 4, with the layout structure of that embodiment being depicted in FIG. 5.

Directing attention to FIG. 2, there is shown schematically a nonvolatile memory cell 100 having vertically arranged bit line 101, responsive to a voltage $V_B$, first write line 102, responsive to a voltage $V_{W1}$, and second write line 103, responsive to a voltage $V_{W2}$, which vertically oriented lines are respectively connected to row line field effect type access transistors 104, 106 and 107. The three access transistors are enabled concurrently by row line 108, which row line provides to each access transistor gate electrode a voltage $V_R$. The cell further includes in the series path between access transistor 104 and ground potential a field effect type sense transistor 109. The conductive state of sense transistor 109 is defined by the polarity and magnitude of the charge on floating gate electrode 111. Thereby, the presence or absence of specified polarity charge on floating gate electrode 111 can be detected by sensing the conductive path between bit line 101 and ground.

The selective transfer of charge to or from floating gate electrode 111 is responsive to the magnitude and polarity of the electric field across dielectric layer 112, which is created by the voltages $V_{W1}$ and $V_{W2}$ on write lines 102 and 103 when access transistors 106 and 107 are enabled. The rate at which charge is transferred depends on the highly nonlinear characteristics of the thin dielectric region 112 which separates conductively doped region 113 from extension 114 of floating gate electrode 111. Though dielectric layer 112 is preferably composed of thin, thermally grown silicon dioxide, so as to utilize Fowler-Nordheim tunneling as the primary charge transfer mechanism, it is also possible to employ silicon nitride, silicon oxynitride, or various combinations of the previous named dielectric materials. The nitride based materials provide for transfers of charge by Poole-Frenkel conduction, and as such, allow higher charge transfer rates, and therefore shorter cell write/programming cycle times. Note that dielectric 112 also creates a capacitor 110 of relatively small value, as specifically established by the thickness and area of dielectric 112 between conductors 113 and 114.

The creation of the electric field across dielectric 112 upon the application of write voltages $V_{W1}$ and $V_{W2}$ and conduction of transistors 106 and 107 is the result of a voltage dividing effect arising from the relative differences between the capacitances of capacitor 110, with dielectric 112, and capacitor 115, formed with dielectric 117. As embodied and depicted, capacitor 115 is defined by the thickness and area of dielectric 117 situated between conductively doped region 118 and extension 116 of floating gate electrode 111. Though it is preferred, from a process efficiency standpoint that the composition and thickness of dielectric 117 be the same as that of 112, it is feasible to use a different dielectric material and/or thickness to individually adjust the capacitive values of devices 110 and 115. However, secondary effects on retention and endurance should not be overlooked.

To understand the operation of nonvolatile memory cell 100, and to more fully appreciate its beneficial features, attention is now directed to Table A. The operational voltages set forth in the table are illustrative of those which might used with a cell configured on a silicon wafer with n-channel field effect transistors, using three micron design rules, a dielectric of approximately 7-10 nanometers of thermally grown silicon dioxide for layers 112 and 117, a write/program cycle of approximately 10 milliseconds, and a relative capacitance between capacitors 115 and 110 of approximately 8:1.

TABLE A

| Function | $V_R$ | $V_{W1}$ | $V_{W2}$ | $V_B$ |
|---|---|---|---|---|
| write 0 | 15 volts | 0 | 15 volts | X |
| write 1 | 15 volts | 15 volts | 0 | X |
| Read | 5 volts | 1 volt | 1 volt | 1 volt |
| Memory Margining TM | 5 volts | Bias | Bias | 1 volt |

X-don't care
Memory Margining is trademark of NCR Corporation

In contrast to nonvolatile memory cells having the arrangement depicted in FIG. 1, which as was specifically noted earlier require an erase cycle before initiating a write/program cycle, the cell according to the present invention, in FIG. 2, can be written directly into either data state irrespective of the prior data state. For instance, with reference to Table A, if cell 100 is to be programmed to a "0" data state, the voltage $V_R$ is set to be equal to the greater of $V_{W1}$ or $V_{W2}$, and in this particular case to 15 volts, $V_{W1}$ is fixed at 0 volts, and $V_{W2}$ is driven to 15 volts. Upon the lapse of the write/program time interval, the voltages on diffusions 113 and 118 are returned to zero by reducing $V_{W2}$ or $V_R$ to zero. The opposite data state, a "1", is written into memory cell 100 by reversing the voltages on $V_{W1}$ and $V_{W2}$ during the write/program cycle.

Under both write/program conditions floating gate electrode 111 is capacitively coupled to the potential on line 118 by virtue of the relative capacitances of 110 and 115 to impress across thin dielectric layer 112 an electric field proportional to the relative voltage and of a polarity defined by write voltages $V_{W1}$ and $V_{W2}$.

The polarity of the write voltages define the direction and nature of the charge transferred through dielectric 112. For example, during the writing/programming of a "0" binary state into cell 100 electrons move through dielectric 112 by Fowler-Nordheim tunneling from region 114 of floating gate electrode 111 to conductively doped region 113. This results in a net positive charge being retained on floating gate 111 when the write voltage ceases. The positive charge on gate 111 thereafter biases sense transistor 109 to a conductive state. For the writing/programming of a "1", the voltages $V_{W1}$ and $V_{W2}$ are reversed, to retain floating gate 111 a residual negative charge and thereby disable sense transistor 109

As further shown in Table A, the state programmed into memory cell 100 is read by biasing $V_R$ to 5 volts, while setting $V_{W1}$, $V_{W2}$ and $V_B$ to 1 volt. It is also possible to utilize a $V_B$ line precharge technique. A conventional sense amplifier connected to line 101 is normally used to detect whether sense transistor 109 is conductively biased by charge on floating gate 111.

Table A also discloses that nonvolatile memory cell 100 is capable of a Memory Margining $_{TM}$ test, in which the threshold window of the nonvolatile memory cell is individually tested to detect the magnitudes of the 0 or 1 threshold levels. For example, as set forth in Table A, $V_R$ may set at 5 volts, $V_B$ set at one volt or other appropriate test voltage, while $V_{W1}$ and $V_{W2}$ are varied to detect the bias voltage at which sense transistor 109 commences or ceases conduction. The relatively large capacitive coupling of lines 113 and 118 to floating gate 111 allows the potential of floating gate 111 to be shifted by an amount equal to the mathematical sum of the previously written floating gate potential due to the charge remaining plus the bias potential.

Foremost, it should be understood and appreciated that nonvolatile memory cell 100 exhibits the highly desirable absence of any read disturb. Note, that according to the arrangement depicted in FIG. 2 the thin dielectrics 112 and 117 are not subject to the electric field produced by read voltage $V_B$, in that sense transistor 109 and access transistor 104 are situated in a separate conductive path. For instance, with reference to the prior art in FIG. 1, if $V_{B0}$ were set at 1 volt and $V_W$ were set to 0 volts dielectric 14 would be subject to a relative electric field, while according to the present invention, as embodied in FIG. 2, sense voltage $V_B$ is never applied to an electrode or conductively doped region common to either a charge transfer dielectric or the relatively large capacitor dielectric. Therefore, the quantity of the charge on floating gate electrode 111 is not diminished by a read operation on cell 100. As was noted earlier, this is extremely important in applications where highly repetitive addressing of the cell data is possible.

In addition to this particularly important feature of the present memory cell configuration, recall that this present cell, in distinction from the prior art, is of a direct write configuration, for a single cycle for programming, retains the Memory Margining capability, is configured with a floating gate structure, and can be fabricated in a single poly process with minimum alteration to the fabrication cycle.

Figure 3:
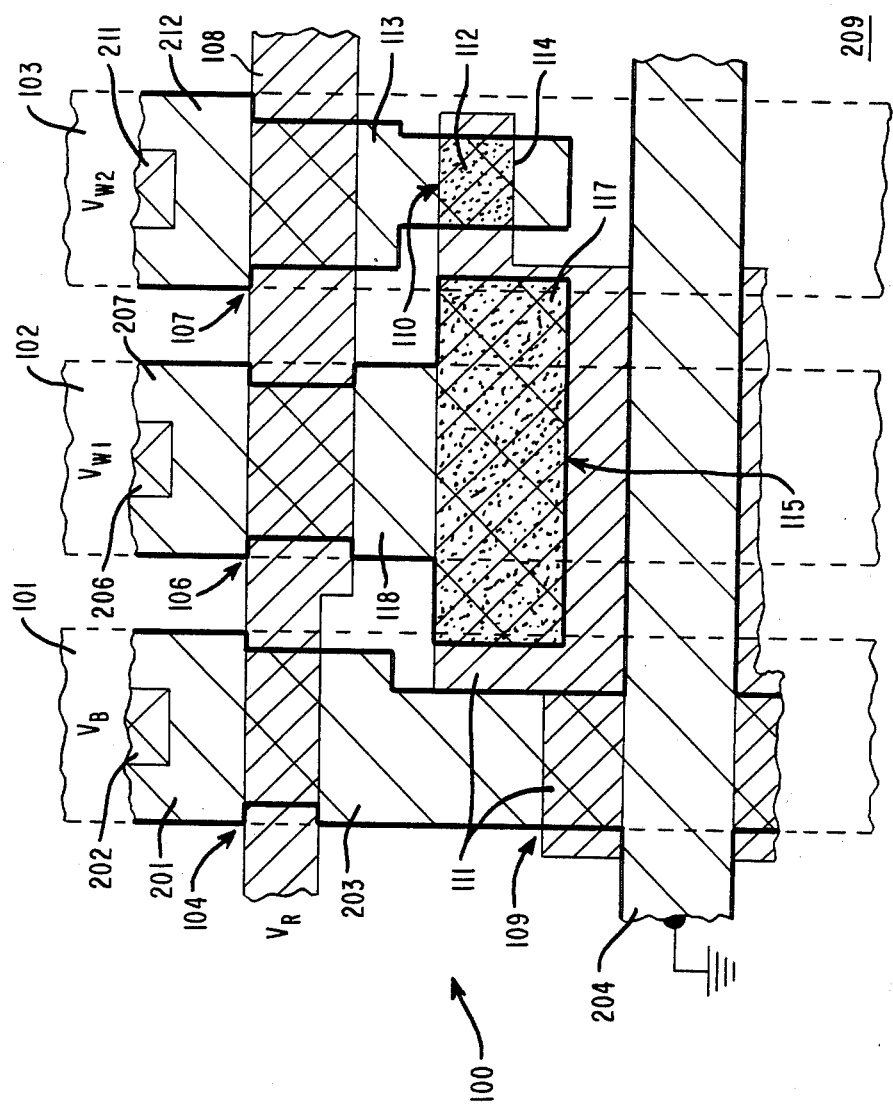
FIG. 3 is a layout pattern for the cell schematically depicted in FIG. 2.

To more fully appreciate the structural arrangement of the memory cell 100 and any related implications on cell fabrication, there is shown in FIG. 3 a layout of a representative cell which implements the features ascribed to the cell shown schematically in FIG. 2. Functionally corresponding parts are identified by the same reference numerals. As viewed, bit line 101 resides in a upper metallization layer defined by the dash lines, and is connected to diffused region 201 by contact 202. Diffusion 201 constitutes the drain electrode of field effect transistor 104 formed by the overlying first conductively doped polysilicon layer gate electrode 108, a row line. The source electrode of transistor 104 is diffused region 203. Between diffusion 203, which also serves as the drain electrode of sense field effect transistor 109, and ground electrode 204, also a diffused region, there is shown an overlying extension of first polysilicon floating gate electrode 111 operating as the gate electrode of transistor 109.

The middle column of nonvolatile memory cell 100 is similarly arranged, beginning with an upper level metal electrode 102 connected by contact 206 to diffused region 207, which diffusion 207 serves as the drain electrode of field effect transistor 106 formed by the overlying, shared polysilicon gate electrode 108. As embodied, conductively doped region 118 serves as the source electrode of field effect transistor 106, where it exists as a diffused region, and an electrically common conductively doped region coextensive with dielectric 117, where it exists as an implanted region. As shown in FIG. 3, conductive region 118 has lateral projections to increase the surface area of capacitor 115. Conductive region 118 is separated from floating gate 111 by a thin dielectric 117, shown by stipple.

The last of the three columns, also includes an upper level metal conductor 103, here connected by way of contact 211 to diffused drain region 212 of field effect transistor 107, which transistor is formed by overlying, shared polysilicon gate electrode 108. As embodied, conductively doped region 113 serves as the source electrode of field effect transistor 107, where it exists as a diffused region, and an electrically common conductively doped region coextensive with dielectric 112, where it exists as an implanted region. Extension 114 of polysilicon floating gate electrode 111 is electrically isolated from conductively doped region 113 at the intersection of 113 and 114 by thin dielectric 112 to form capacitor 110. Recall the earlier comparison of the sizes of capacitors 110 and 115, and the charge transfer occurring at 110 between conductively doped region 113 and floating gate electrode 111.

Preferably, the layout of FIG. 3 would be formed in a p-type monocrystalline silicon substrate, generally 209, with n-channel field effect transistors. However, the invention is not so limited and is fully suitable for use with CMOS processes involving n-well, p-well or twin tub configurations. Likewise, though reference is made to a doped first polysilicon layer and an upper metallization layer, the electrodes could be formed from any conductive material and fully contemplate the alternate use of refractory metals, silicides and polycides.

Note that the layout of the structural elements which make up the cell lends itself to a dense arrangement in which the diffusion and metal pitch are matched. Furthermore, the symmetry in the circuit patterns facilitates area efficient arrangements of the cells into matrix arrays.

Though it is preferred that the thin dielectrics 112 and 117 be composed of approximately 7-10 nanometers of silicon dioxide thermally grown from the monocrystalline silicon substrate, generally 209, it is also feasible to deposit the silicon dioxide or to use nitride based dielectrics which are either directly deposited or converted from silicon dioxide, including but not limited to thin composite layers of silicon dioxide, silicon nitride, and silicon oxynitride. A number of different dielectric arrangements are described with greater specificity in copending applications having Ser. No. 06/709,630 (filed 3/8/85) and Ser. No. 06/921,835 ( filed 10/23/86) which is a continuation of Ser. No. 06/709,632 (filed 3/8/85) assigned to the assignee of the present application.

Figure 4:
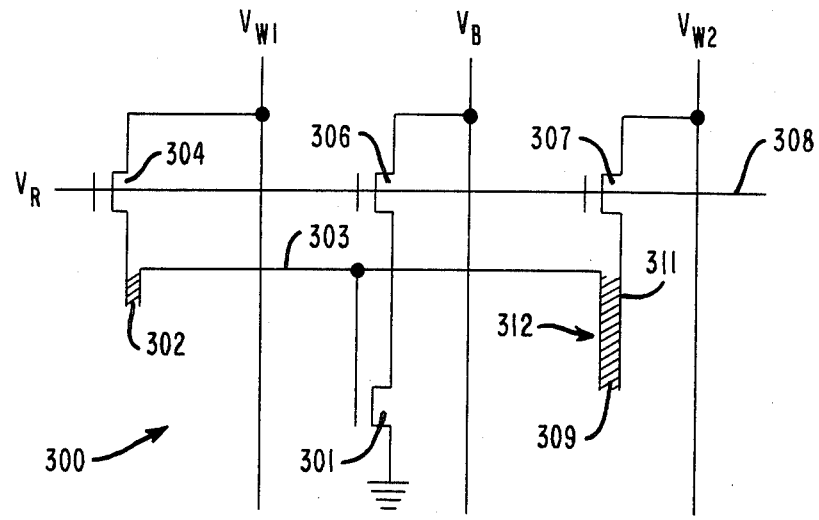
FIG. 4 is the electrical schematic for the alternate embodiment of the cell to which this invention pertains.
Figure 5:
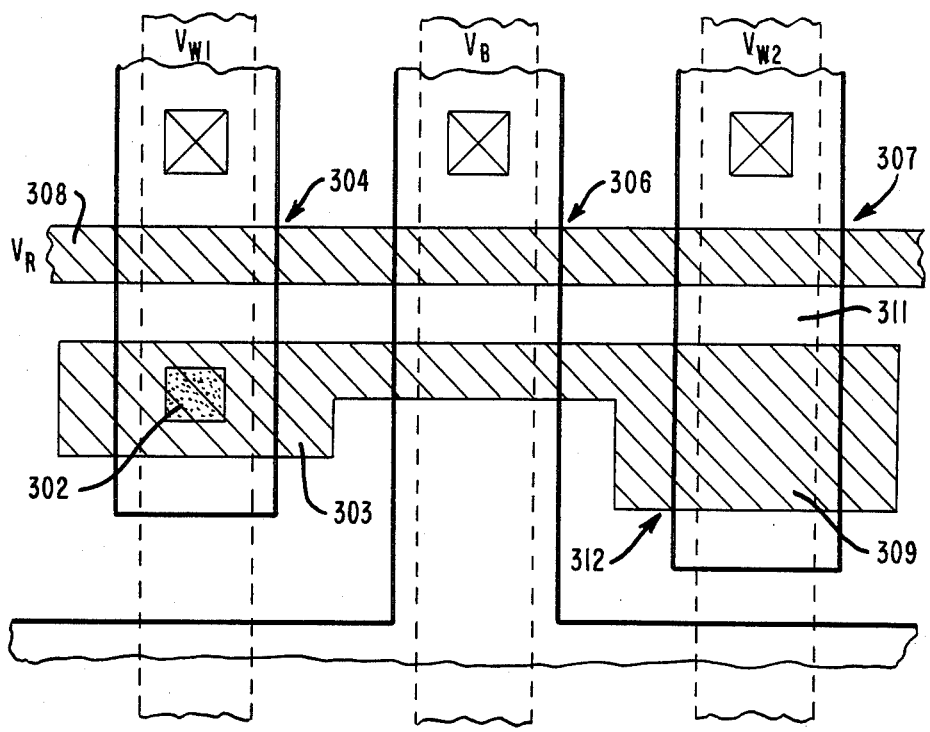
FIG. 5 is a lay out of the embodiment shown in FIG. 4.

A functionally similar but structurally different nonvolatile memory cell 300 is depicted schematically in FIG. 4, and by way layout in FIG. 5. In this case, sense transistor 301 is situated within the central column of the three. The effects of this rearrangement on the structure are more pronounced in the layout depicted in FIG. 5. As a further element of difference, the embodiment depicted in FIG. 5 utilizes a smaller area for the thin dielectric region 302, through which charge is transferred to and removed from poly one level floating gate electrode 303. Again, as was true of the cell depicted in FIGS. 2 and 3, row line electrode 308, which enable access transistors 304, 306 and 307, is a poly one level electrode. However, in contrast to the embodiment of the present invention as depicted in FIGS. 2 and 3, the embodiment in FIG. 5 employs a relatively thick dielectric 309 to form the coupling capacitor between floating gate electrode 303 and the diffusion 311 extending from the source electrode of field effect transistor 307. According to this practice of the invention, the dielectric composition and thickness of 309 would be comparable to that used to isolate the gate electrode 308 from the channel regions of field effective transistors 304, 306 and 307. Note that the area of charge transfer though thin dielectric 302 is further reduced in relation to the area of the coupling capacitor 312 in order to maintain a substantially similar ratio of capacitances and thereby insure that the write/program voltage which appears across the thin, charge transfer dielectric 302 is adequate to provide the necessary degree of charge tunneling or conduction.

Again, as was true of the embodiment set forth in FIGS. 2 and 3, the composition of the thin dielectric 302 may be thermally grown or deposited silicon dioxide or a nitride based dielectric.

Figure 6:
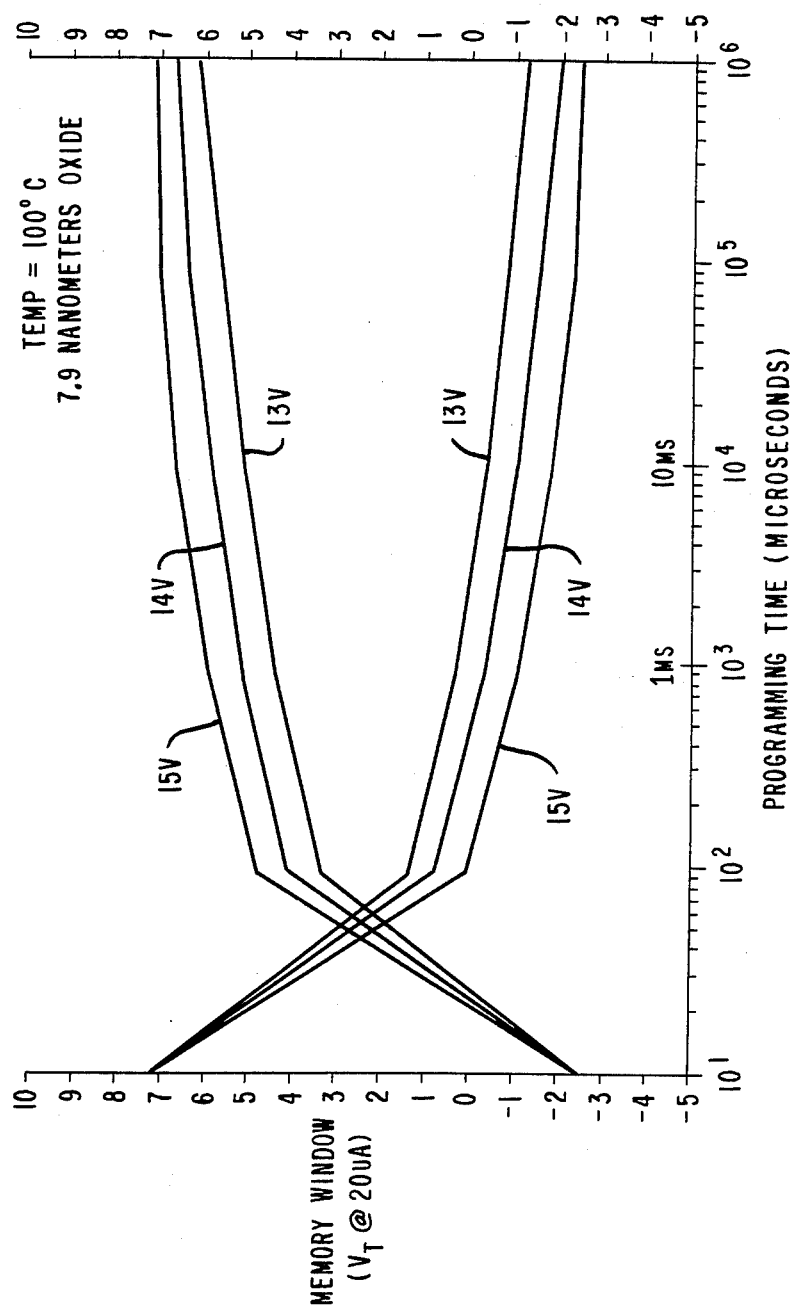
FIGS. 6, 7 and 8 depict representative programming, endurance, and retention characteristics for the nonvolatile memory cell to which this invention pertains.
Figure 7:
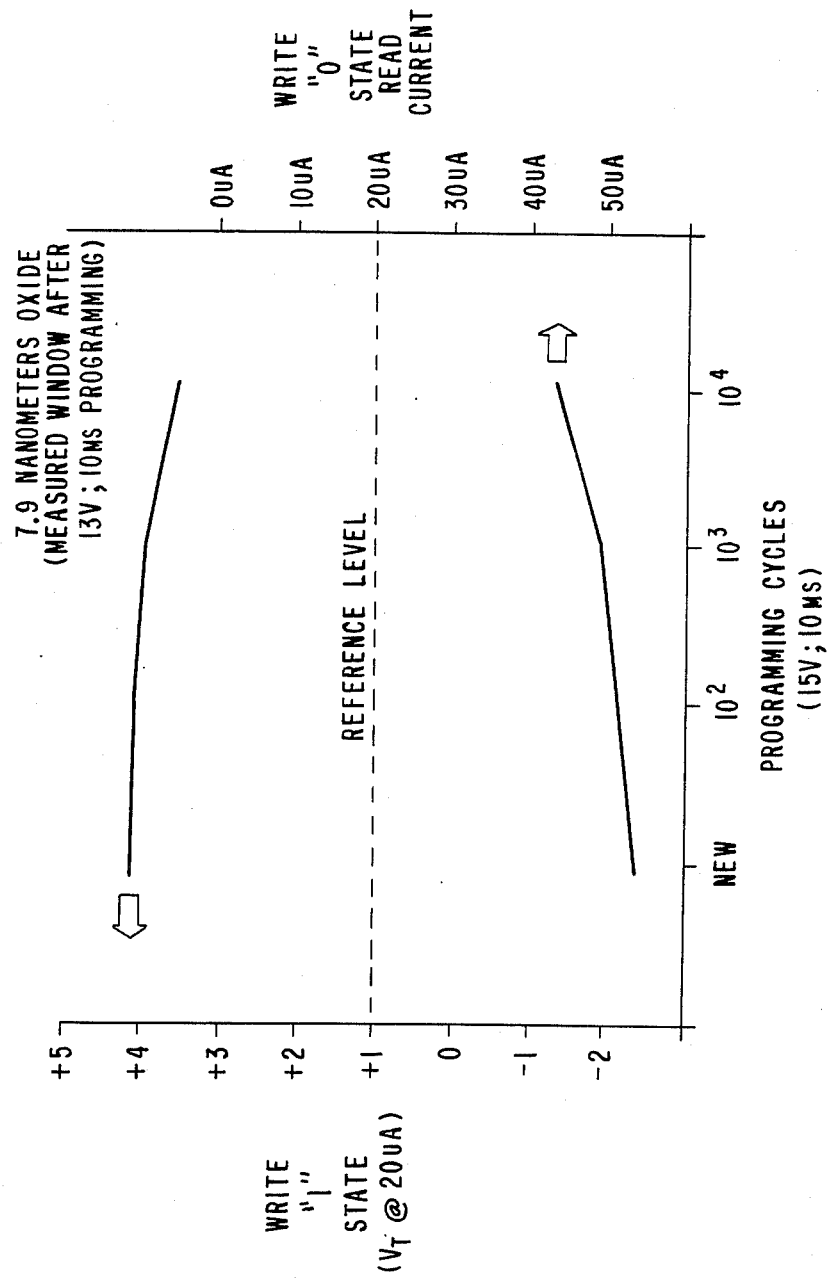
Figure 8:
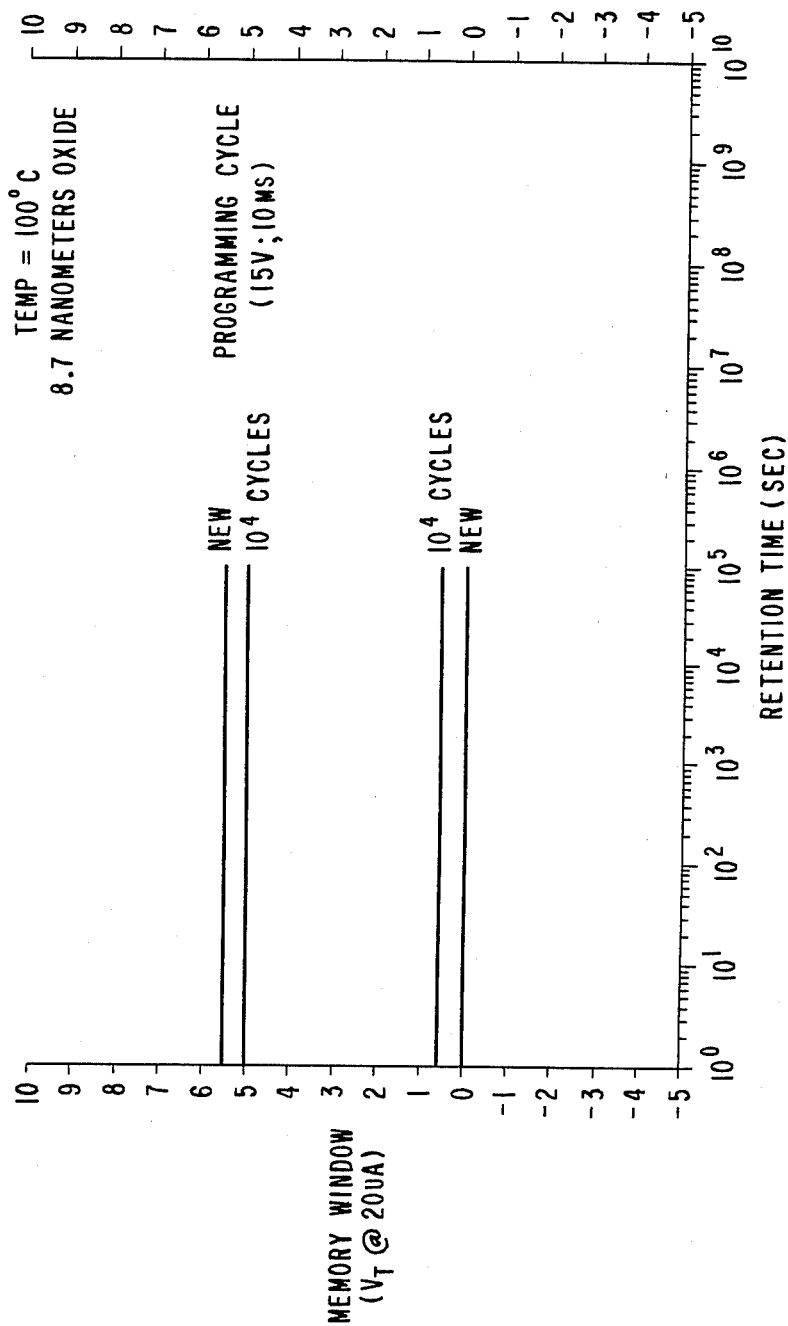

FIGS. 6, 7 and 8 depict representative performance characteristics for a nonvolatile memory cell of the form depicted in FIGS. 2 and 3. Cells having such characteristics generally utilize for dielectrics 112 and 117 a 7-10 nanometer thick silicon dioxide layer, which can for example, be formed by thermal oxidation of the substrate silicon in an $O_2+3\%$ HCl ambient at atmospheric pressure and an 800°-850° C. temperature for approximately 5-10 minutes. Preferably, the ambient would be diluted with argon to more precisely control the oxidation rate. For the depicted characteristics the sense transistor threshold voltage used to establish the memory window was measured at a current flow of 20 microamps.

FIG. 6 shows the effects of programming time and write/program voltages on the memory window. An analysis of FIG. 6 discloses that such a cell can be programmed in significantly less time than 10 milliseconds while using write/program voltages which are compatible with normal logic circuit fabrication technologies.

The plots of endurance characteristics as depicted in FIG. 7 confirm that the cell to which this invention pertains has a performance comparable to that exhibited by functionally similar commercial products. The long term data storage capabilities of the cell are illustrated by the minimal slope in the plots of FIG. 8, where the composite effects of repeated writing/programming and storage time are shown for both "0" and "1" data states.

What is claimed is:
1. A floating gate type nonvolatile memory cell formed in a semiconductor substrate, comprising:
   a floating gate electrode having four defined regions over the semiconductor substrate;
   a first conductively doped region in the substrate, situated beneath the first region of the floating gate electrode and separated therefrom by a first dielectric material layer to form thereby a coupling of first capacitance;
   a second conductively doped region in the substrate, situated beneath the second region of the floating gate electrode and separated therefrom by a second dielectric material layer to form a coupling of second capacitance, materially less than the first capacitance, and defined a region of charge transfer through the second dielectric material layer;
   third and fourth conductively doped regions in the substrate which are electrically isolated from the first and second conductively doped regions, defining therebetween a channel situated beneath the third region of the floating gate electrode and separate therefrom by a third dielectric material layer, to form a field effect transistor responsive to the charge resident on the floating gate electrode;

access means for selectively connecting the third conductively doped region in the substrate to a bit line, selectively connecting the first conductively doped region in the substrate to a first write line, and selectively connecting the second conductively doped region in the substrate to a second write line; and means for selectively applying potentials of first relative polarity between the first and second write lines suitable to cause a transfer of charge in one direction through the second dielectric material layer, or of a second relative polarity between the first and second write lines to cause a transfer of charge in the opposite direction through the second dielectric material layer.

2. The apparatus recited in claim 1, wherein the three selective connections of the access means are enabled simultaneously.

3. The apparatus recited in claim 2, wherein the first and second dielectric material layers are of the same composition and approximately the same thickness.

4. The apparatus recited in claim 3, wherein the potentials of first or second relative polarity created by the means for selectively applying potentials are coincident in time with the enablement of the access means, and the access means is comprised of three individual field effect transistors arranged to selectively connect the third conductively doped region in the substrate to the bit line, the first coductively doped region in the substrate to the first write line, and the second conductively doped region in the substrate to the second write line.

5. The apparatus recited in claim 4, further comprising a means for applying a potential to the bit line and for detecting the presence or absence of conduction of charge through the third region.

6. The apparatus recited in claim 5, wherein the gate electrodes of the access means field effect transistor are commonly connected to form a first row line, the fourth conductively doped region in this substrate is at ground potential, and the first capacitance exceeds the second capacitance by a ratio of approximately 8:1.

7. The apparatus recited in claim 6, wherein the floating gate electrode is a first conductive layer of doped polysilicon, and the first and second dielectric material layers are comprised of approximately 7-10 nanometers thick thermally grown silicon dioxide.

8. The apparatus recited in claim 6, wherein the floating gate electrode is a first conductive layer having refractory metal silicide, and the first and second dielectric material layers are comprised of approximately 7-10 nanometers thick thermally grown silicon dioxide.

9. The apparatus recited in claim 6, wherein multiple cells are configured into a matrix array having as row lines the first row lines and lines of ground potential, and having as column lines the bit lines and the first and second write lines.

* * * * *

UNITED STATES PATENT AND TRADEMARK OFFICE
CERTIFICATE OF CORRECTION

PATENT NO. : 4,683,554

DATED : July 28, 1987

INVENTOR(S) : George C. Lockwood et al.

It is certified that error appears in the above—identified patent and that said Letters Patent is hereby corrected as shown below:

Column 8, line 49, delete "four" and substitute --three--.

Signed and Sealed this

Twenty-second Day of March, 1988

Attest:

DONALD J. QUIGG

*Attesting Officer*  *Commissioner of Patents and Trademarks*